US012525473B2

(12) United States Patent
Maleev et al.

(10) Patent No.: US 12,525,473 B2
(45) Date of Patent: Jan. 13, 2026

(54) OPTICAL SENSOR FOR REMOTE TEMPERATURE MEASUREMENTS

(71) Applicant: Tokyo Electron Limited, Tokyo (JP)

(72) Inventors: Ivan Maleev, Fremont, CA (US); Yan Sun, San Jose, CA (US); Zheng Yan, Fremont, CA (US)

(73) Assignee: Tokyo Electron Limited, Tokyo (JP)

(*) Notice: Subject to any disclaimer, the term of this patent is extended or adjusted under 35 U.S.C. 154(b) by 386 days.

(21) Appl. No.: 18/321,432

(22) Filed: May 22, 2023

(65) Prior Publication Data

US 2023/0395408 A1    Dec. 7, 2023

Related U.S. Application Data

(60) Provisional application No. 63/347,713, filed on Jun. 1, 2022.

(51) Int. Cl.
*G01N 21/64* (2006.01)
*H01L 21/67* (2006.01)

(52) U.S. Cl.
CPC ... *H01L 21/67248* (2013.01); *G01N 21/6489* (2013.01); *H01L 21/67057* (2013.01); *G01N 2021/6471* (2013.01)

(58) Field of Classification Search
CPC ............ G01K 11/3213; G01N 21/6489; H01L 21/67248
See application file for complete search history.

(56) References Cited

U.S. PATENT DOCUMENTS

| 8,710,860 B2 | 4/2014 | Trupke et al. |
| 9,482,625 B2 | 11/2016 | Trupke et al. |
| 9,912,291 B2 | 3/2018 | Trupke et al. |

(Continued)

FOREIGN PATENT DOCUMENTS

| JP | 2006-189261 A | 7/2006 |
| JP | 2015-187598 A | 10/2015 |
| KR | 2002-0029453 A | 4/2002 |

OTHER PUBLICATIONS

Hieu T. Nguyen, et al., "Temperature dependence of the band-band absorption coefficient in crystalline silicon from photoluminescence," Journal of Applied Physics, vol. 115, 043710, 2014, 10 pages.

(Continued)

*Primary Examiner* — Walter L Lindsay, Jr.
(74) *Attorney, Agent, or Firm* — Oblon, McClelland, Maier & Neustadt, L.L.P.

(57) ABSTRACT

Aspects of the present disclosure provide a sensor for remote temperature measurement. For example, the sensor can include a light source configured to form an illumination beam, focusing optics configured to direct the illumination beam from the light source onto a semiconductor sample at an illuminated spot thereof, for exciting bandgap photoluminescence (PL) light in the semiconductor sample, collection optics configured to collect the bandgap PL light excited from the semiconductor sample, at least one optical detector configured to measure spectral intensities of the bandgap PL light in a vicinity of a semiconductor bandgap wavelength of the semiconductor sample, and transmission optics configured to transmit the bandgap PL light from the collection optics to the at least one optical detector.

24 Claims, 9 Drawing Sheets

(56) References Cited

U.S. PATENT DOCUMENTS

| | | |
|---|---|---|
| 11,047,800 B2 | 6/2021 | Eriguchi et al. |
| 2014/0191776 A1 | 7/2014 | Trupke et al. |
| 2018/0061691 A1* | 3/2018 | Jain .................. H01L 22/12 |
| 2023/0230887 A1* | 7/2023 | Storek ................ G01J 5/0875 |
| | | 438/14 |
| 2025/0216268 A1* | 7/2025 | Kalinovski .............. G01J 5/58 |
| 2025/0224282 A1* | 7/2025 | Abel .................... G01K 11/12 |

OTHER PUBLICATIONS

G. G. MacFarlane, et al., "Fine Structure in the Absorption-Edge Spectrum of Si," Physical Review, vol. 111, No. 5, Sep. 1, 1958, pp. 1245-1254.
International Search Report and Written Opinion of the International Searching Authority issued on Sep. 15, 2023 in PCT/US2023/023321, citing documents 1-5 and 15-17 therein, 8 pages.

\* cited by examiner

OPTICAL SENSOR FOR REMOTE TEMPERATURE MEASUREMENTS

INCORPORATION BY REFERENCE

This present disclosure claims the benefit of U.S. Provisional Application No. 63/347,713, "OPTICAL SENSOR FOR REMOTE TEMPERATURE MEASUREMENTS" filed on Jun. 1, 2022, which is incorporated herein by reference in its entirety.

FIELD OF THE PRESENT DISCLOSURE

The present disclosure relates generally to temperature measurements, and, in particular, to optical sensors for remote temperature measurements in semiconductor wafer wet manufacturing processes.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Semiconductor wafer wet manufacturing processes may require a remote sensor to detect temperature of wafers inside a container filled with processing liquid, where both the container walls and the processing liquid may not be transparent to mid-infrared wavelengths. This lack of transparency rules out the use of traditional radiation-based temperature sensors.

One example is a wet etch process where a batch of wafers are placed inside a quartz bath filled with a processing liquid containing phosphoric acid ($H_3PO_4$), water, and similar chemicals. Multiple quartz baths may be nested one within another, separated by processing liquid-filled regions. Wafer temperature sensing must occur along optical paths traversing the quartz walls, and across the processing liquid-filled regions, which processing liquid may contain bubbles. The bubbles present in the processing liquid may cause problems, e.g., signal fluctuation, due to movement within the liquid, for example. A statistical window filter may be employed to remove the signal fluctuations, noise and other anomalies. It may be critical for process control to accurately measure the wafer temperature inside the quartz bath, and preferably at multiple points across the wafer, so wet etch process uniformity can be inferred from the wafer temperature distribution.

If wafer temperatures range from 100 to 170° C., the corresponding peak of black-body radiation is in the 6 to 8 µm wavelength region, in the mid-infrared, while quartz transmits infrared (IR) radiation only below wavelengths of approximately 4 µm. IR transmission of water and $H_3PO_4$ are negligible above wavelengths of about 1.7 µm.

The need clearly exists for a sensor that can measure wafer temperature in such challenging optical access conditions, utilizing parts of the optical spectrum that are not affected by IR transmission loss, i.e., primarily in the near infrared (NIR).

SUMMARY

Disclosed is a concept of a remote temperature sensor that allows measurement of temperature of wafers or other objects comprising silicon (Si) or other semiconductor materials placed inside containers made of quartz or similar materials, and immersed in liquids opaque to mid-infrared. The disclosed method does not rely on thermal radiation from the wafer itself.

The concept is based on the physical effect of semiconductor band-to-band absorption measurements from photoluminescence (PL). The effect relies on the temperature dependence of the distribution of electrons in the semiconductor valence and conduction bands. At higher temperatures electrons generally occupy higher energy levels. Information about the electron distribution across energy levels may be obtained by illuminating a sample with photons of a known wavelength and analyzing an acquired spectrum of PL photons emitted by the illuminated sample. Sample temperature may be determined from characteristics of the PL spectrum, such as the spectral peak wavelength and the spectral intensity distribution.

In a preferred embodiment, a near-infrared (NIR) light source with focusing optics creates an illuminated spot on the sample made of semiconductor material. Collection optics are used to collect bandgap PL light emitted by the sample at the illuminated spot and transmit it to an optical detector such as a spectrometer or other suitable detector which allows spectral analysis in the bandgap wavelength region, typically around 1100 nm for silicon (Si). The spectral intensity distribution of bandgap PL light can be used to determine the sample temperature, using a suitable calibration.

Aspects of the present disclosure provide a sensor for remote temperature measurement. For example, the sensor can include a light source configured to form an illumination beam, focusing optics configured to direct the illumination beam from the light source onto a semiconductor sample at an illuminated spot thereof, for exciting bandgap photoluminescence (PL) light in the semiconductor sample, collection optics configured to collect the bandgap PL light excited from the semiconductor sample, at least one optical detector configured to measure spectral intensities of the bandgap PL light in a vicinity of a semiconductor bandgap wavelength of the semiconductor sample, and transmission optics configured to transmit the bandgap PL light from the collection optics to the at least one optical detector.

In an embodiment, the transmission optics can include a notch filter configured to suppress transmission of light at a wavelength of the illumination beam. In another embodiment, the transmission optics can include at least one of a dichroic mirror, a beam splitter and an optical fiber.

In an embodiment, the focusing optics and the collection optics can utilize the same lens for focusing the illumination beam onto the semiconductor sample and for collecting the bandgap PL light from the semiconductor sample, respectively. In another embodiment, the light source can include a near-infrared (NIR) laser diode or a light emitting diode (LED). In some embodiments, the illumination beam can have a wavelength of 785 nm.

In an embodiment, the at least one optical detector can include a prism or grating spectrometer. In some embodiments, the at least one optical detector can include at least two single-pixel detectors, each of which can have an optical bandpass filter disposed in front thereof, each of the optical bandpass filters configured to transmit a wavelength or a range of wavelengths in the vicinity of the semiconductor bandgap wavelength of the semiconductor sample. For example, the single-pixel detectors can be photodiodes. As another example, the photodiodes can be silicon (Si) photodiodes, germanium (Ge) photodiodes, or InGaAs photodiodes. In an embodiment, the optical bandpass filters of the at least two single-pixel detectors can have passband wavelengths of 1050 nm and 1125 nm, respectively.

In an embodiment, the semiconductor sample can be a semiconductor wafer disposed within a wet processing bath, and the focusing optics and the collection optics can be configured to direct the illumination beam onto the semiconductor wafer and collect the bandgap PL light from the semiconductor wafer, respectively, through one or more walls of the wet processing bath and through processing liquid present in the wet processing bath. For example, the one or more walls can be nested and include quartz. As another example, the processing liquid can include at least one of $H_3PO_4$, $H_2O$, $H_2O_2$, and $H_2SO_4$.

In an embodiment, the sensor can further include a controller configured to acquire PL spectral light intensities from the at least one optical detector and determine temperature of the semiconductor sample from the acquired PL spectral light intensities.

Aspects of the present disclosure also disclose a temperature measurement apparatus. For example, the temperature measurement apparatus can include a base plate. The temperature measurement apparatus can further include a plurality of the above-mentioned sensors of claim 1 mounted on and arranged across the base plate, the sensors configured to measure temperature of one or more semiconductor samples.

In an embodiment, the base plate can be disposed substantially parallel to one of the one or more semiconductor samples, and the sensors can be configured to determine a temperature distribution across a surface of the one of the one or more semiconductor samples at a plurality of illuminated spots thereon that correspond to the sensors. In another embodiment, the base plate can be disposed substantially perpendicular to the one or more semiconductor samples, and the sensors can be configured to measure temperature at an edge or in a region proximate the edge of at least one of the one or more semiconductor samples.

In an embodiment, the temperature measurement apparatus can further include a temperature control system configured to control temperature of the base plate and the sensors. For example, the temperature control system can include a temperature-controlled fluid manifold in contact with or embedded within the base plate. As another example, the temperature control system can include one or more thermoelectric (TE) devices in contact with the base plate.

Aspects of the present disclosure also disclose a wet semiconductor-processing system. For example, the wet semiconductor-processing system can include a wet semiconductor-processing bath. The wet semiconductor-processing system can further include the above-mentioned temperature measurement apparatus. In an embodiment, the temperature measurement apparatus can be configured to measure temperature of one or more semiconductor samples disposed within the wet semiconductor-processing bath through one or more walls of the wet semiconductor-processing bath and through processing liquid in the wet semiconductor-processing bath.

Aspects of the present disclosure also disclose a method for remote temperature measurement. For example, the method can include illuminating a semiconductor sample with an illumination beam, to excite bandgap photoluminescence (PL) light in the semiconductor sample. The method can also include measuring spectral intensities of the bandgap PL light excited from the semiconductor sample, and determining temperature of the semiconductor sample based on the measured spectral intensities.

In an embodiment, measuring spectral intensities of the bandgap PL light can include measuring spectral intensities of the bandgap PL light at two wavelengths or two ranges of wavelengths in a vicinity of a semiconductor bandgap wavelength of the semiconductor sample.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present disclosure can be embodied and viewed in many different ways.

Note that this summary section does not specify every embodiment and/or incrementally novel aspect of the present disclosure or claimed disclosure. Instead, this summary only provides a preliminary discussion of different embodiments and corresponding points of novelty over conventional techniques. For additional details and/or possible perspectives of the present disclosure and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION

The following description is provided in the context of the use of a remote temperature sensor for measurement of the temperature of a semiconductor sample, e.g., a semiconductor wafer, placed inside a wet semiconductor-processing bath. It will be understood that the same method, apparatus, and system therefor are applicable to other remote temperature measurements of objects that exhibit bandgap photoluminescence (PL), in a variety of environments.

Figure 1:
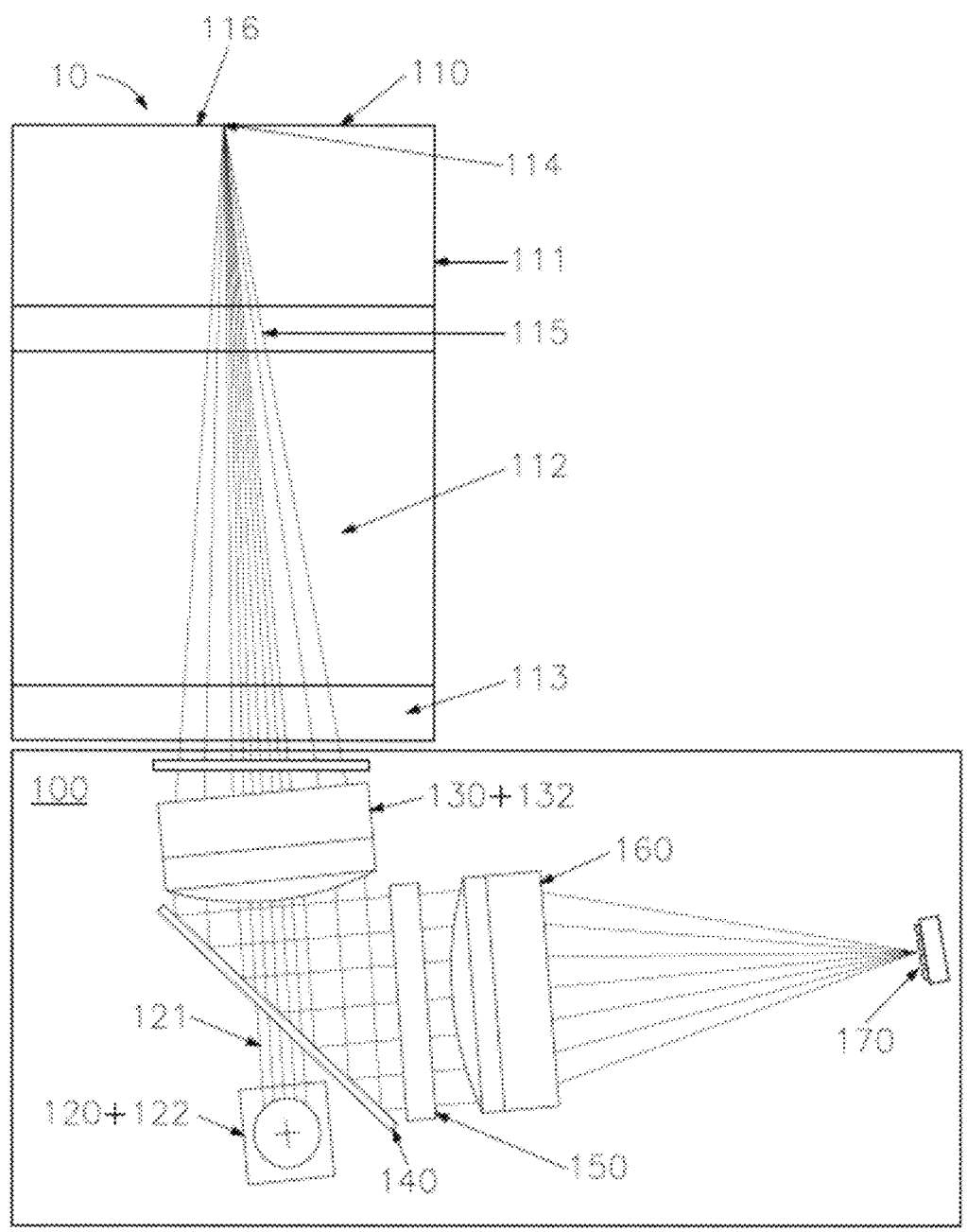
FIG. 1 is a schematic diagram of an exemplary wet semiconductor-processing system in accordance with some embodiments of the present disclosure.

FIG. 1 is a schematic diagram of an exemplary wet semiconductor-processing system 10 according to some embodiments of the present disclosure. The wet semiconductor-processing system 10 can include a sensor 100, e.g., a temperature sensor, that is used to detect the temperature of an object 110, e.g., a semiconductor sample such as a semiconductor wafer, e.g., a silicon (Si) wafer, in a wet semiconductor-manufacturing process. In an embodiment, a film, e.g., a resist layer, may be formed on the wafer 110. In the wet semiconductor-manufacturing process, the wafer 110 can be located inside a wet semiconductor bath (or a wet semiconductor-processing bath) 111 that is filled with processing liquid 112. In an embodiment, the wet processing bath 111 may include multiple containers (e.g., made of quartz) that are nested one within another and separated by regions that are filled with the processing liquid 112. In some embodiments, both of the processing liquid 112 and walls 113 (e.g., made of quartz) of the wet processing bath 111 (or of the multiple containers) may not be transparent to mid-infrared wavelengths. In an embodiment, the processing liquid 112 may contain at least one of water, $H_2O_2$, $H_2SO_4$, phosphoric acid ($H_3PO_4$), and similar chemicals.

The sensor 100 can include a light source 120 that is used to form an illumination beam 121. In an embodiment, the light source 120 can be a near infrared (NIR) light source, such as a laser diode or a light emitting diode (LED) operating at a wavelength of 785 nm, for example, and can form the illumination beam 121 that is IR light (or NIR light). Other light source wavelengths may be used, e.g., visible light, and alternative embodiments may include a narrowband LED or a broadband light source with an interference filter to select the wavelength range for wafer illumination.

Optionally, the sensor 100 can further include an illumination collimator 122. In an embodiment, the illumination collimator 122 can be built in the light source 120, as shown in FIG. 1. In another embodiment, the illumination collimator 122 can be separated from the light source 120. The illumination collimator 122 can be used to collimate the illumination beam 121 formed by the light source 120.

In an embodiment, the sensor 100 can further include focusing optics 130. The focusing optics 130 can be used to direct the collimated illumination beam 121 onto a wafer surface 116 of the wafer 110 to form an illuminated spot 114 thereon. Before reaching the illuminated spot 114, the collimated illumination beam 121 may traverse multiple quartz wall(s) 113 and multiple regions filled with the processing liquid 112. The illumination beam 121 directed onto the wafer surface 116 (i.e., at the illuminated spot 114), optionally through the film formed on the wafer 110, can excite the wafer 110 to emit photon flux, in this case called bandgap photoluminescent (PL) light (or PL light) 115. In one aspect, penetration of the illumination beam 121 through a film formed on the substrate enables temperature measurement of the underlying wafer without regard to the film.

In an embodiment, the sensor 100 can further include collection optics 132. In an embodiment, the collection optics 132 can be integrated with the focusing optics 130 and include the same focusing lens, as shown in FIG. 1. In another embodiment, the focusing optics 130 and collection optics 132 can be separated and not aligned along the same optical axis. The angle of incidence of the illumination beam 121 and the angle of the axis of the excited and collected PL light 115 may or may not have a normal orientation with respect to the wafer surface 116. Preferably, the angle of incidence of the illumination beam 121 has a non-normal orientation with respect to the wafer surface 116, so that the illumination beam 121 at excitation wavelength after reflection from the wafer surface 116 is not admitted back into the collection optics 132, thereby reducing the risk of light contamination. The collection optics 132 are designed to collect the PL light 115 excited by the wafer 110 at the illuminated spot 114. In an embodiment, the PL light 115 generally has a Lambertian distribution, and the purpose of the collection optics 132 is to collect as much of the PL light 115 as possible, after traversing the quartz walls 113 and the processing liquid 112, and pass the collected PL light 115 to an optical detector 170 with minimal losses.

In an embodiment, the sensor 100 can further include detector focusing optics (transmission optics) 160. The detector focusing optics 160 can direct and transmit the PL light 115 from the collection optics 132 onto the optical detector 170. In the example embodiment in FIG. 1, a dichroic mirror (DM) 140 is used to separate the NIR light of the illumination beam 121 from the PL light 115 and direct the PL light 115 towards the optical detector 170. In some embodiments, the detector focusing optics 160 can further include a beam splitter and an optical fiber. In an embodiment, because the illumination beam 121 may be of so much higher intensity than the collected PL light 115, a notch filter 150 with "notch center" wavelength corresponding to the wavelength of the NIR light source 120, e.g., 785 nm, may be used to further remove any illumination beam 121 scattered into the optical detector path.

The optical detector 170 can be used to acquire and analyze the spectrum (or spectral intensities) of the PL light 115 from which the temperature of the wafer 110 can be determined (at the location of the illuminated spot 114). In an embodiment, the optical detector 170 may be a prism or grating spectrometer with a CCD, CMOS, photodiode (PD) array, position-sensitive device (PSD), etc., detector.

In an embodiment, the PL light 115 may be focused by the detector focusing optics 160 onto the end of an optical fiber (not shown) which would transmit the PL light 115 to an optical detector, e.g., the optical detector 170, that is located remotely from the focusing optics 130, the collection optics 132 and the wet processing bath 111. In some embodiments, the sensor 100 can further include another optical fiber that is disposed between the light source 120 and the focusing optics 130 configured to transmit the illumination beam 121 from the NIR light source 120 to the focusing optics 130.

According to the present disclosure, temperature measurements of sufficient accuracy do not require measurements of full PL spectra with high wavelength resolution, and the measurements of at least two light wavelengths in the vicinity of the bandgap wavelength of the PL light 115 are enough for sufficiently accurate determination of the temperature of the wafer 110 at the illuminated spot 114.

Figure 2:
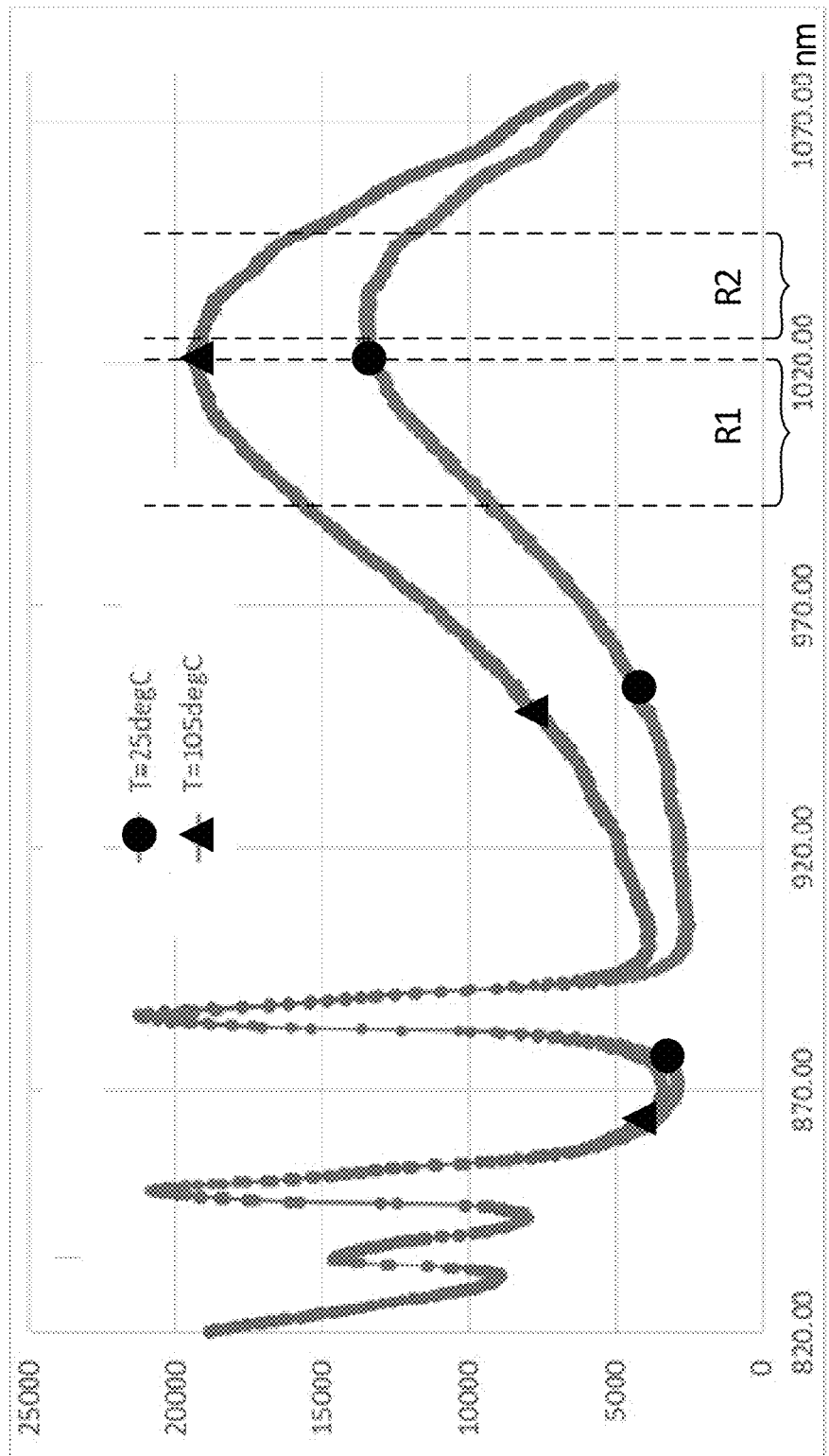
FIG. 2 shows the spectral distributions of PL light for silicon (Si), which undergoes a shift of spectral peak with temperature.

FIG. 2 shows the spectral distributions (or spectral intensities or spectrum) of PL light, e.g., the PL light 115, for silicon (Si), e.g., the silicon wafer 110, which undergoes a shift of spectral peak with temperature, e.g., 25° C. and 105° C. The spectral distributions are plotted without the presence of processing liquid, e.g., the processing liquid 112; however, spectral distributions with processing liquid exhibit the same spectral features but at a diminished signal level. With dual photodiodes or similar sensors measuring the spectral intensities of PL light at wavelengths $\lambda_1$ & $\lambda_2$ that are in the vicinity of bandgap wavelength of 1100 nm of the PL light, it is possible to use the measured intensities along with a suitable calibration to determine the temperature of the silicon wafer 110. For example, as the ratio of the spectral intensities at two wavelengths changes with the temperature of the wafer 110, the ratio of the spectral intensities at the two wavelengths $\lambda_1$ & $\lambda_2$ may be correlated to the temperature. A simpler or more complex metric and calibration involving the measured spectral intensities may be utilized. In an embodiment, the two wavelengths $\lambda_1$ & $\lambda_2$ can be selected within one or more highly sensitive regions of the spectrum of the PL light, e.g., regions R1 and R2, where the ratio of the spectral intensities of the PL light 115 at the two wavelengths $\lambda_1$ & $\lambda_2$ and the difference between the spectral distributions of the PL light 115 measured at different temperatures are large.

For more accuracy, more than two spectral intensities may be measured and utilized in the calibration and temperature determination. In an embodiment, the term "vicinity" may indicate a distance at 1, 2, 3, . . . , 99, 100, . . . , 199 or 200 nm from the bandgap wavelength.

Figure 3:
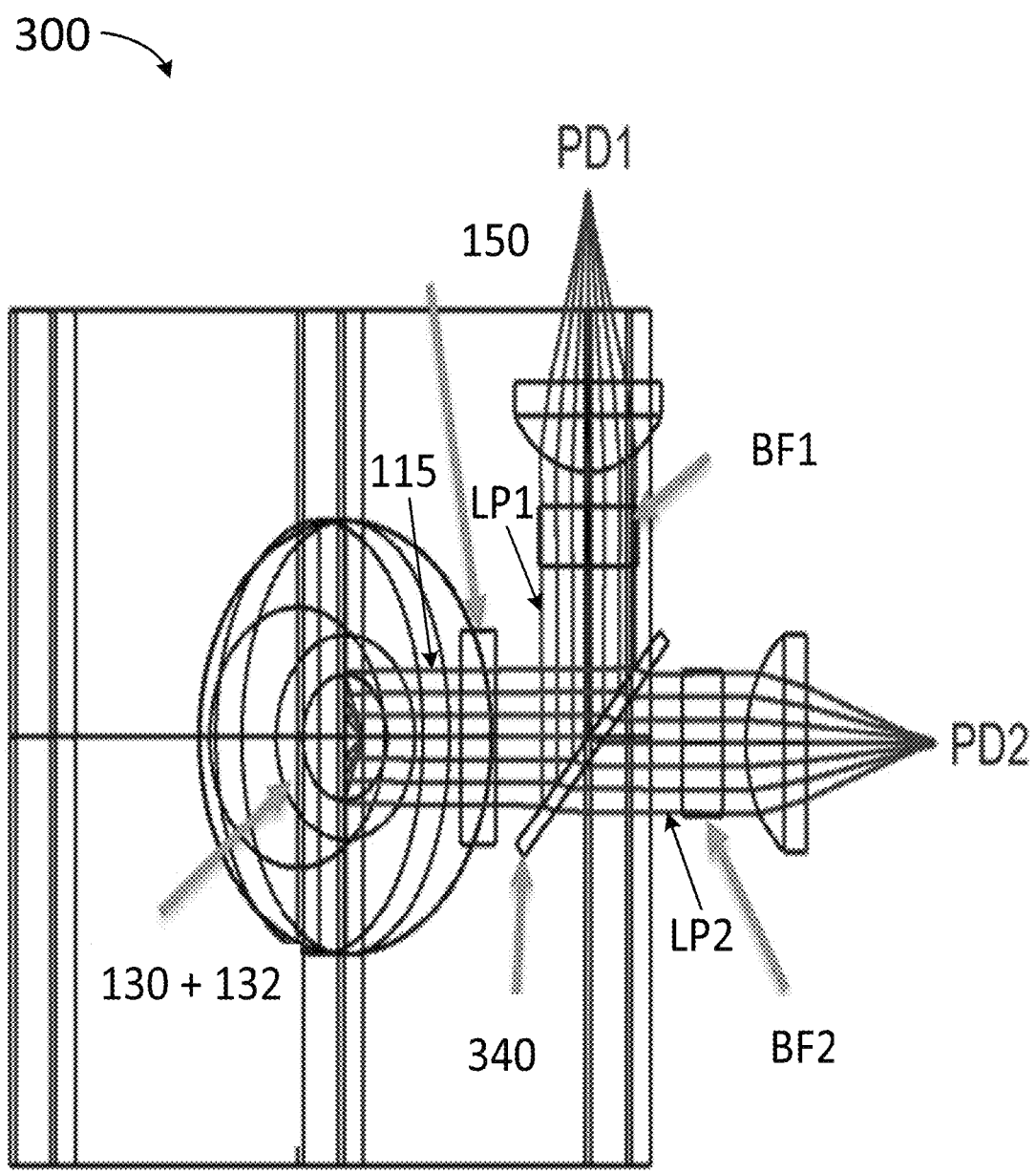
FIG. 3 is a schematic diagram of an exemplary sensor in accordance with some embodiments of the present disclosure.

FIG. 3 is a schematic diagram of an exemplary sensor 300, e.g., a temperature sensor, according to some embodiments of the present disclosure. The sensor 300 is less expensive than the sensor 100. Similar to the sensor 100, the sensor 300 can also include the light source 120, the optional illumination collimator 122 (shown in FIG. 1), the focusing optics 130 and the collection optics 132. In an embodiment, the sensor 300 can further include at least two photodiodes, instead of the optical detector 170. For example, the sensor 300 can include a first photodiode PD1 and a second photodiode PD2, or similar single-pixel detectors. In some embodiments, the first photodiode PD1 and/or the second photodiode PD2 can be silicon (Si) photodiodes, germanium (Ge) photodiodes, or InGaAs photodiodes. In an embodiment, each of the first and second photodiodes PD1 and PD2 can have a corresponding spectral bandpass filter disposed in the PL light path ahead of the photodiode. For example, a first bandpass filter BF1 can be located in a first PL light path LP1 ahead of the first photodiode PD1, and a second bandpass filter BF2 can be located in a second PL light path LP2 ahead of the second photodiode PD2. In an embodiment, the first and second bandpass filters BF1 and BF2 may be selected to pass PL light wavelengths of 1050 nm and 1125 nm to the first and second photodiodes PD1 and PD2, respectively, both wavelengths being in the vicinity of the 1100 nm bandgap wavelength of Si. In an embodiment, the sensor 300 can further include a dichroic mirror (DM) 340, which may be used to split off and deflect a portion of the PL light 115 onto its corresponding spectral bandpass filter and photodiode. In FIG. 3, the light source path is perpendicular to the plane of the figure prior to being deflected towards the wafer. A notch filter, e.g., the notch filter 150, for suppression of scattering of NIR light, e.g., the illumination beam 121 (shown in FIG. 1), into the first and second photodiodes PD1 and PD2 may also be used, as shown in FIG. 3.

In an embodiment, the first and second photodiodes PD1 and PD2 can be used to measure spectral intensities of the PL light 115 in the 1050 nm and 1125 nm wavelength ranges, and the signals generated by the first and second photodiodes PD1 and PD2 can be fed into processing electronics (not shown) for amplification, filtering, AD conversion, and further processing needed for determination of the wafer temperature. For example, the sensor 300 (or the sensor 100) can further include a controller coupled to the first and second photodiodes PD1 and PD2 (or the optical detector 170) and configured to acquire PL spectral light intensities from the first and second photodiodes PD1 and PD2 (or the optical detector 170) and determine temperature of the wafer 110 from the acquired PL spectral light intensities. The sensor 300 includes the first and second bandpass filters BF1 and BF2 to filter noise. For example, the presence of bubbles in processing liquid, e.g., the processing liquid 112 (shown in FIG. 1), may cause measured spectral intensities of the PL light 115 to contain a lot of noise.

Furthermore, if the levels of the processing liquid 112 in the wet processing bath 111 (shown in FIG. 1) vary such that the illumination beam 121 and the PL light 115 traverse air or other gas environment due to free surface of the processing liquid 112 in the wet processing bath 111 being below the sensor 100/300 position, a different calibration may be required to account for the different media (air vs. processing liquid) along the optical path, and the sensor, e.g., the sensors 100 and 300, and a measurement system, e.g., the wet semiconductor-processing system 10, will need to be able to monitor the levels of the processing liquid 112 and account for the media present during measurement.

Figure 4A:
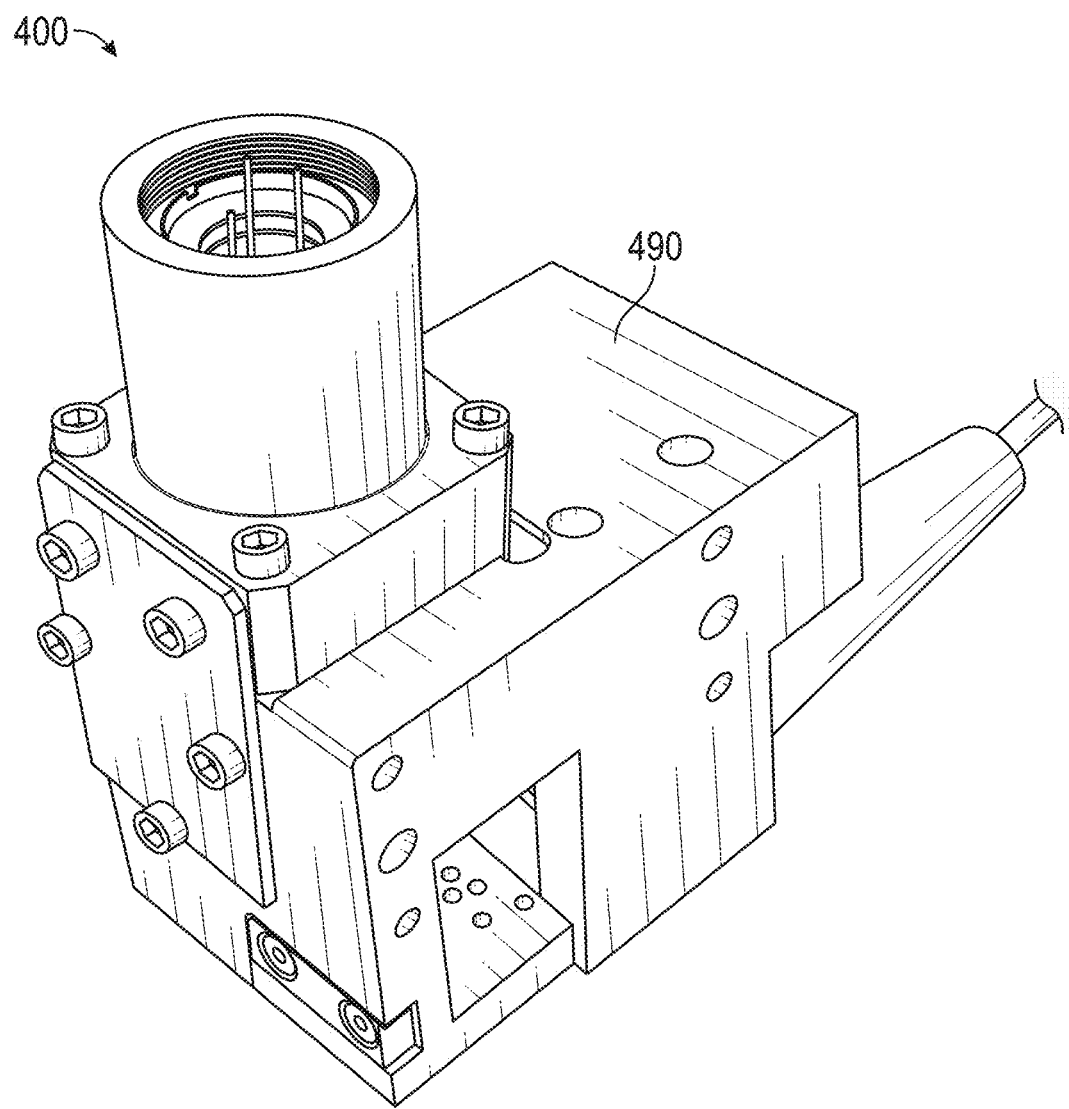
FIGS. 4A and 4B show a mechanical assembly of an exemplary single temperature sensor in accordance with some embodiments of the present disclosure.
Figure 4B:
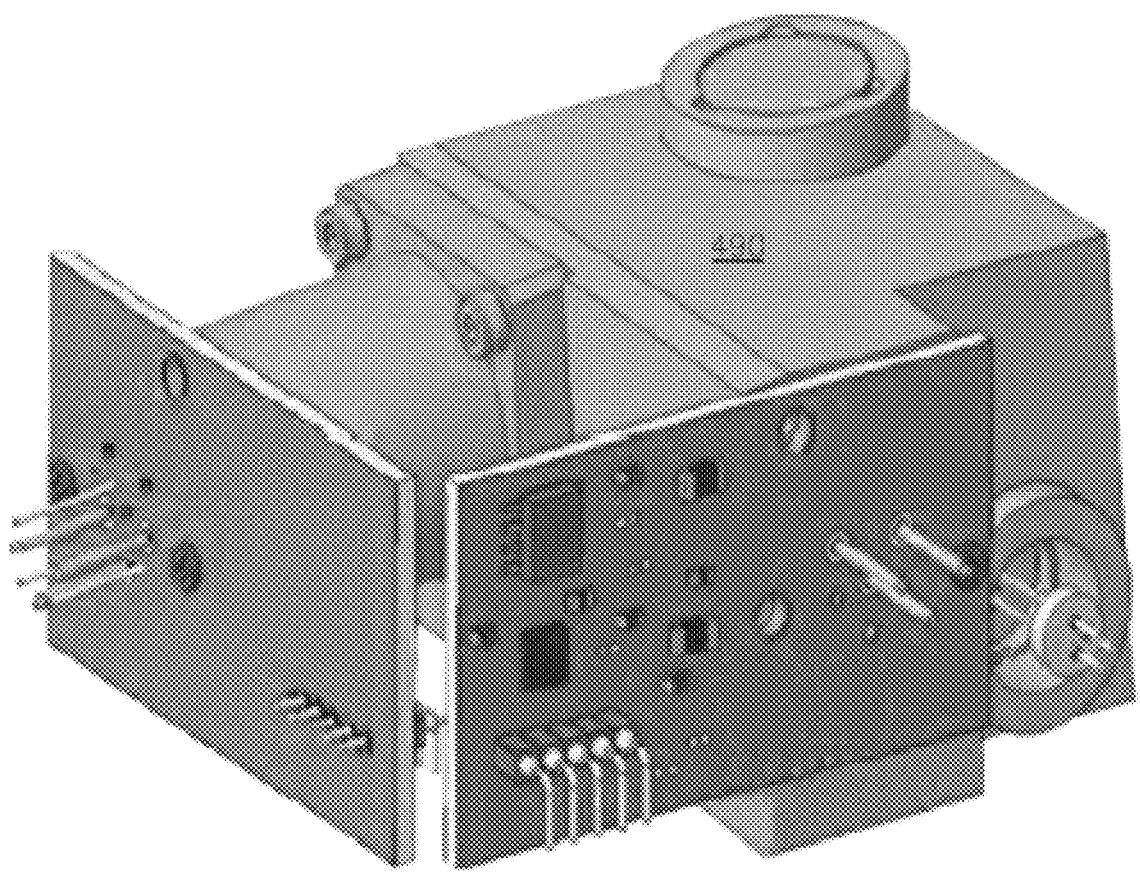

FIGS. 4A and 4B show a sensor assembly (or a wafer temperature measurement apparatus) 400 of an exemplary single temperature sensor, e.g., the sensor 100 or 300, in accordance with some embodiments of the present disclosure. The light source 120, the first and second photodiodes PD1 and PD2, the first and second bandpass filters BF1 and BF2, the focusing optics 130 and the collection optics 132 (shown in FIGS. 1 and 3) of the sensor 300 can be all integrated into a metallic housing 490, e.g., a metallic housing. In an embodiment, the metallic housing 490 can have a high thermal conductivity allowing the sensor assembly 400 to be properly externally cooled to ensure stability of the output of the light source 120 and low noise levels for the first and second photodiodes PD1 and PD2. In one embodiment, and with sufficient cooling and temperature stabilization, inexpensive silicon (Si) photodiodes may be used for the first and second photodiodes PD1 and PD2. In other embodiments, InGaAs or germanium (Ge) photodiodes may be used for the first and second photodiodes PD1 and PD2. Unlike in other optical measurement techniques, the PL temperature measurement application does not necessarily require a stabilized NIR light source. In an embodiment, the NIR light source 120 may be a 50 to 500 mW laser diode with a built-in monitoring/reference photodiode. With the aforementioned sensor configuration, wafer temperature measurement sensitivities of less than 0.5° C. have been demonstrated on a poly-Si wafer and with processing liquid (and wafer) temperature ranging from 120 to 165° C. in a quartz container (or bath) containing $SC1/H_3PO_4$ processing liquid.

In an alternative embodiment, a spectrometer may be used for measurement of PL intensities in spectral bands selected by a screen with apertures placed in front of optical detectors, e.g., the optical detector 170, which detectors may comprise single-pixel optical detectors, such as photodiodes, e.g., the first and second photodiodes PD1 and PD2.

In a yet further embodiment, a beam splitter may be used instead of a dichroic mirror for splitting PL light to individual optical detectors.

Figure 5:
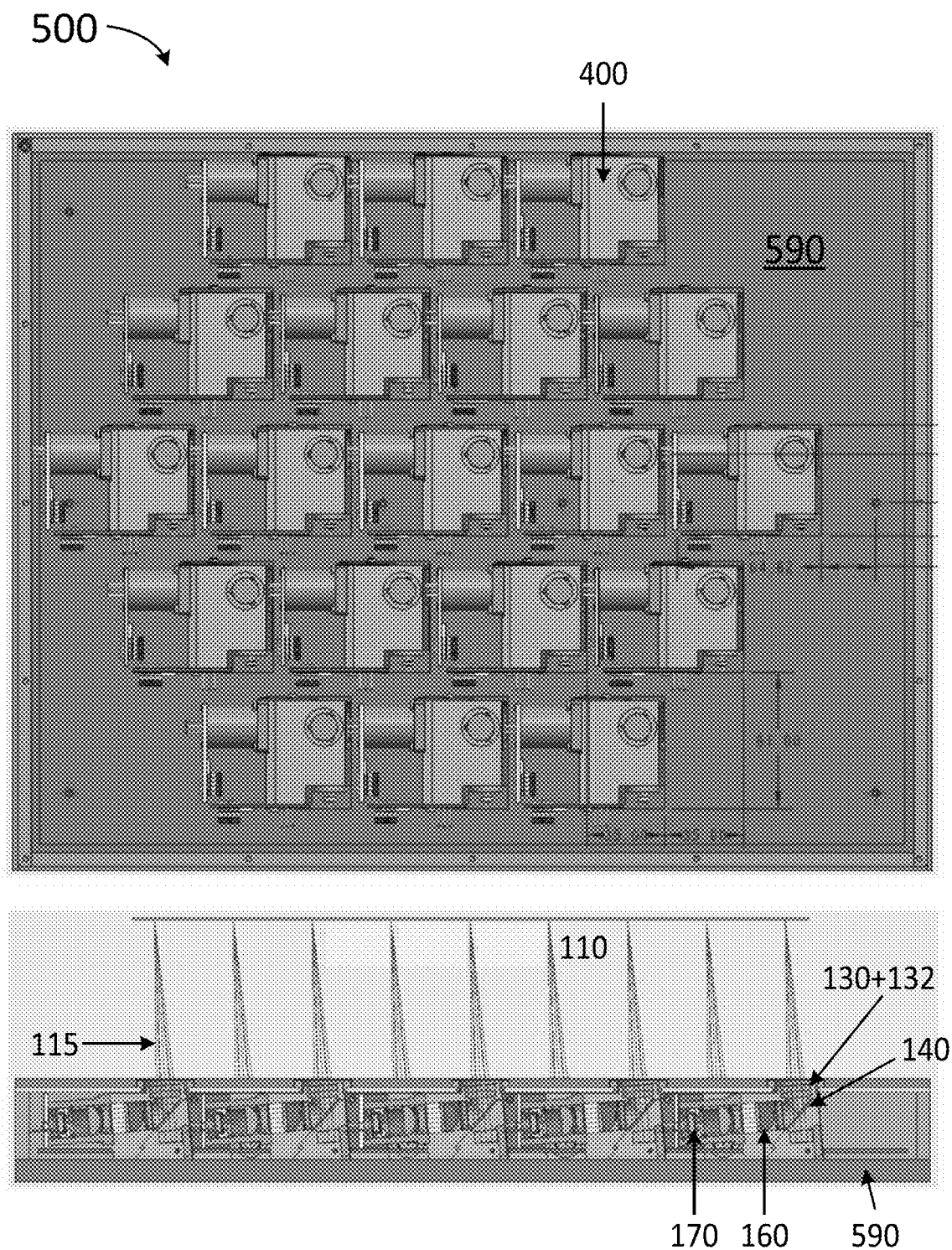
FIG. 5 shows a multi-sensor assembly with multiple sensors in accordance with some embodiments of the present disclosure.

FIG. 5 shows a multi-sensor assembly (or a temperature measurement apparatus) 500 with 19 sensors, e.g., 19 of the sensor assemblies 400, mounted onto a base plate 590, e.g., a metallic base plate, and configured for installation on the side of a wet processing bath, e.g., the wet processing bath 111, which allows measurement of the temperature of the wafer 110 at 19 points, thereby allowing the determination of temperature uniformity across the wafer 110. The metallic base plate 590 has a sufficient thickness and material thermal conductivity to allow efficient cooling and temperature equalization across all the sensors 100 or 300 installed on it. The base plate 590 may include a cooling system (not shown), which may include a fluid cooling system using strapped cooling manifolds, or manifolds embedded within the base plate 590. Alternatively, cooling and temperature regulation may be achieved using thermo-electric (TE) or similar devices attached to the base plate 590. The base plate 590 may also be configured for mounting of electronics, AD converters, power sources, etc. Alternatively, these components may be mounted remotely. In an embodiment, the NIR light sources 120 may be located remotely, with the NIR illumination beams 121 transmitted to the multi-sensor assembly 500 via optical fibers. In another embodiment, a single NIR light source 120 may be located remotely, and split optical fibers may be used to provide the NIR illumination beams 121 to the multiple temperature sensors 100 or 300. Likewise, optical detectors, e.g., the optical detector 170 and the first and second photodiodes PD1 and PD2, may be located remotely, and the PL light 115 can be transmitted via optical fibers to them.

Figure 6:
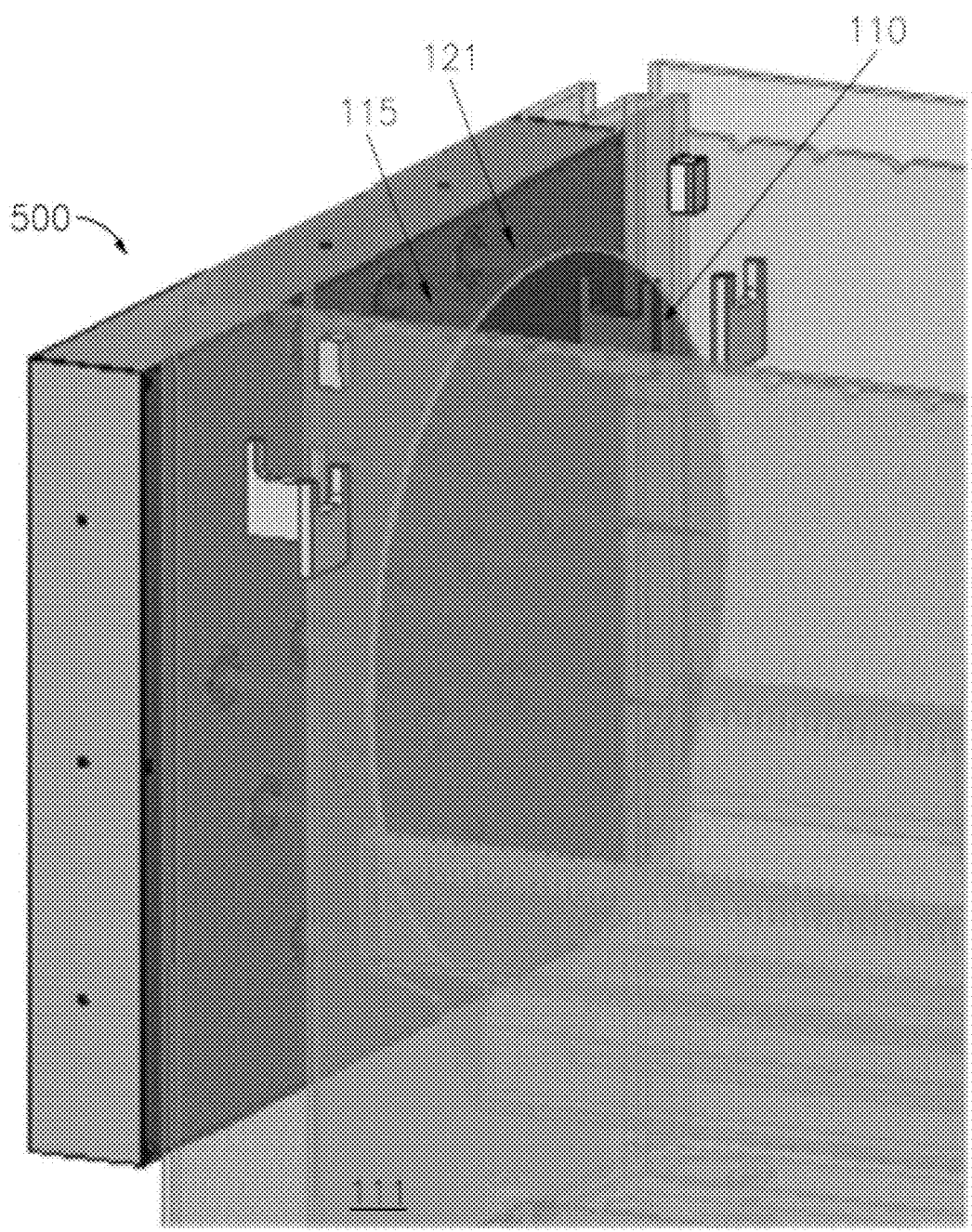
FIG. 6 shows the multi-sensor assembly of FIG. 5 mounted on the side of a wet processing bath in accordance with some embodiments of the present disclosure.

FIG. 6 shows the multi-sensor assembly 500 mounted on the side, e.g., a front side, of a wet processing bath, e.g., the wet processing bath 111, with two nested quartz containers, and facing the first wafer 110 at one end of a wafer batch, so temperature across the wafer 110 at multiple illuminated spots can be measured and used for process control. For example, the base plate 590 of the multi-sensor assembly 500 can be disposed substantially parallel to one of one or more wafers of a wafer batch, e.g., the first wafer 110, and the sensors 100/300 can determine a temperature distribution across a surface of the first wafer 110 at a plurality of illuminated spots thereon that correspond to the sensors 100/300.

Figure 7:
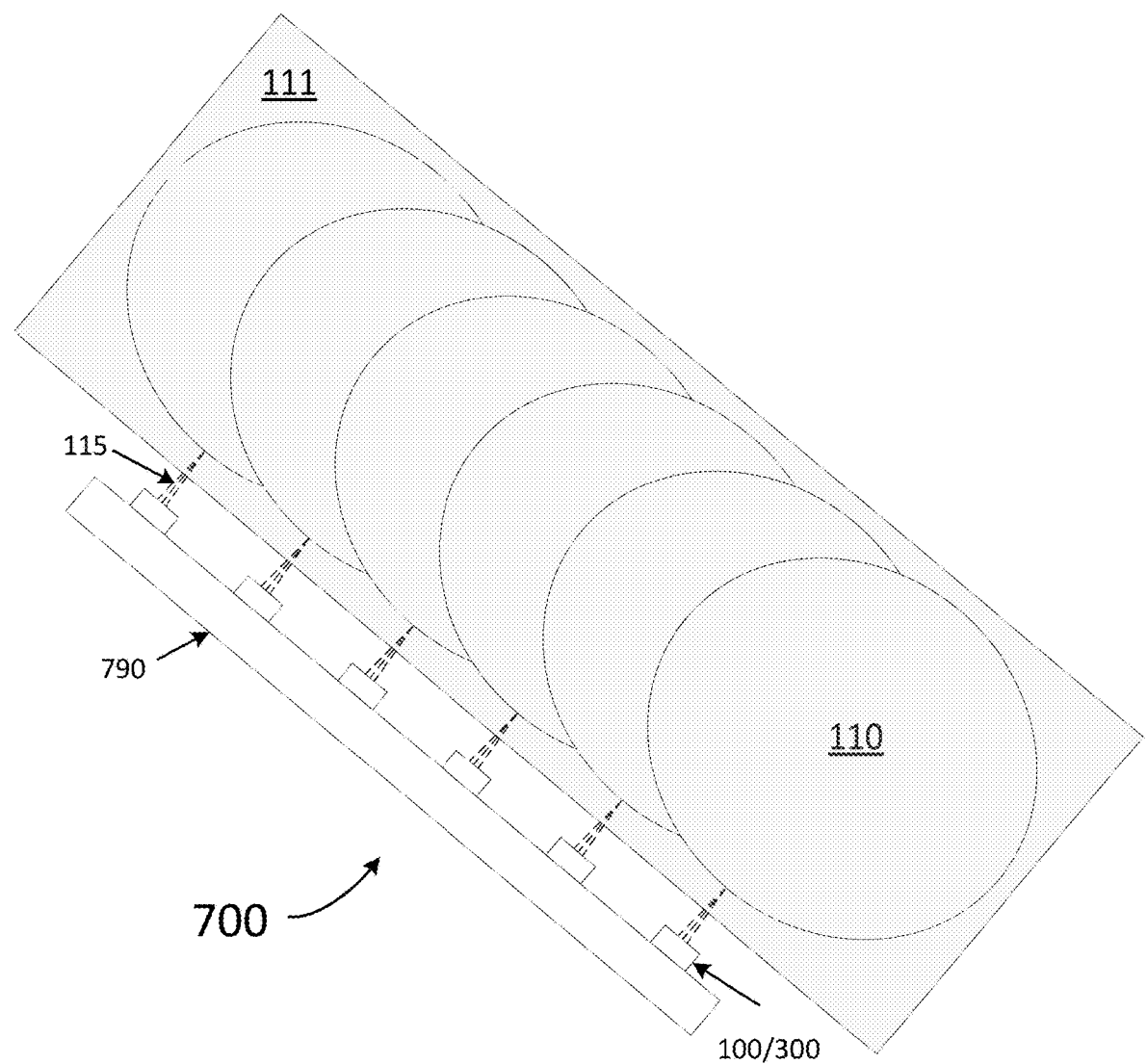
FIG. 7 shows another multi-sensor assembly with multiple sensors in accordance with some embodiments of the present disclosure.

In a configuration of another embodiment shown in FIG. 7, a multi-sensor assembly (or a temperature measurement apparatus) 700 can be made elongated and mounted on another side, e.g., a lateral side, of the wet processing bath 111 facing the edge or an area on the wafer surface inside the wafer bevel of at least one of the wafers 110 of the wafer batch. For example, a base plate 790 of the multi-sensor assembly 700 can be disposed substantially perpendicular to one of a plurality of wafers of a wafer batch, and the sensors 100/300 can measure temperature at the edge of or in a region proximate the edge of the wafer 110. In an embodiment, the multiple sensors, e.g., the sensors 100 and 300, can be disposed on the base plate 790 of the multi-sensor assembly 700 along a straight line, and at least one of the multiple sensors 100/300 can face the edge of a corresponding one of the wafers 110 of the wafer batch. In this configuration, it is possible to determine temperatures of one or more wafers in the batch by directing the illuminated spots from individual sensors 100/300 towards the edges of selected wafers within the wafer batch. In an embodiment, the multiple sensors 100/300 measure the same point (i.e., illuminated spot) of each wafer 110. In another embodiment, multiple sensors 100/300 may be used per wafer 110, allowing more information to be collected on temperature uniformity along the portion of the circumference of the wafer accessible from the temperature sensor location. In some embodiments, the multiple sensors 100/300 may measure the temperature of every other wafer of the wafer batch, as two neighboring wafers may be separated from each other at a small interval. In various embodiments, the multiple sensors 100/300 may be disposed such that one sensor 100/300 may cover more than one wafer 110.

While the sensors 100 and 300 and the sensor assemblies 400, 500 and 700 are uniquely suitable for measurement of wafer temperatures in the wet processing baths 111, it is possible to use a similar sensor for temperature measurement of wafers and/or other components in other types of semiconductor processing tools, e.g., etch tools, deposition tools, coater-developer systems, dry cleaning systems, thermal processing systems, and the like. For such systems, if necessary, optical access could be provided via a window mounted on the processing chamber or module wall and facing the wafer 110 or component whose temperature is to be monitored. Additionally, the sensors 100 and 300 and the sensor assemblies 400, 500 and 700 may be used for in-line temperature monitoring of wafers in transfer chambers or dedicated metrology stations of semiconductor processing tools, etc. In some embodiments, additional sensors may be used to look between the wafers 110 It is further understood that the described temperature sensors and multi-sensor assemblies could also be used in applications nor related to semiconductor processing.

Figure 8:
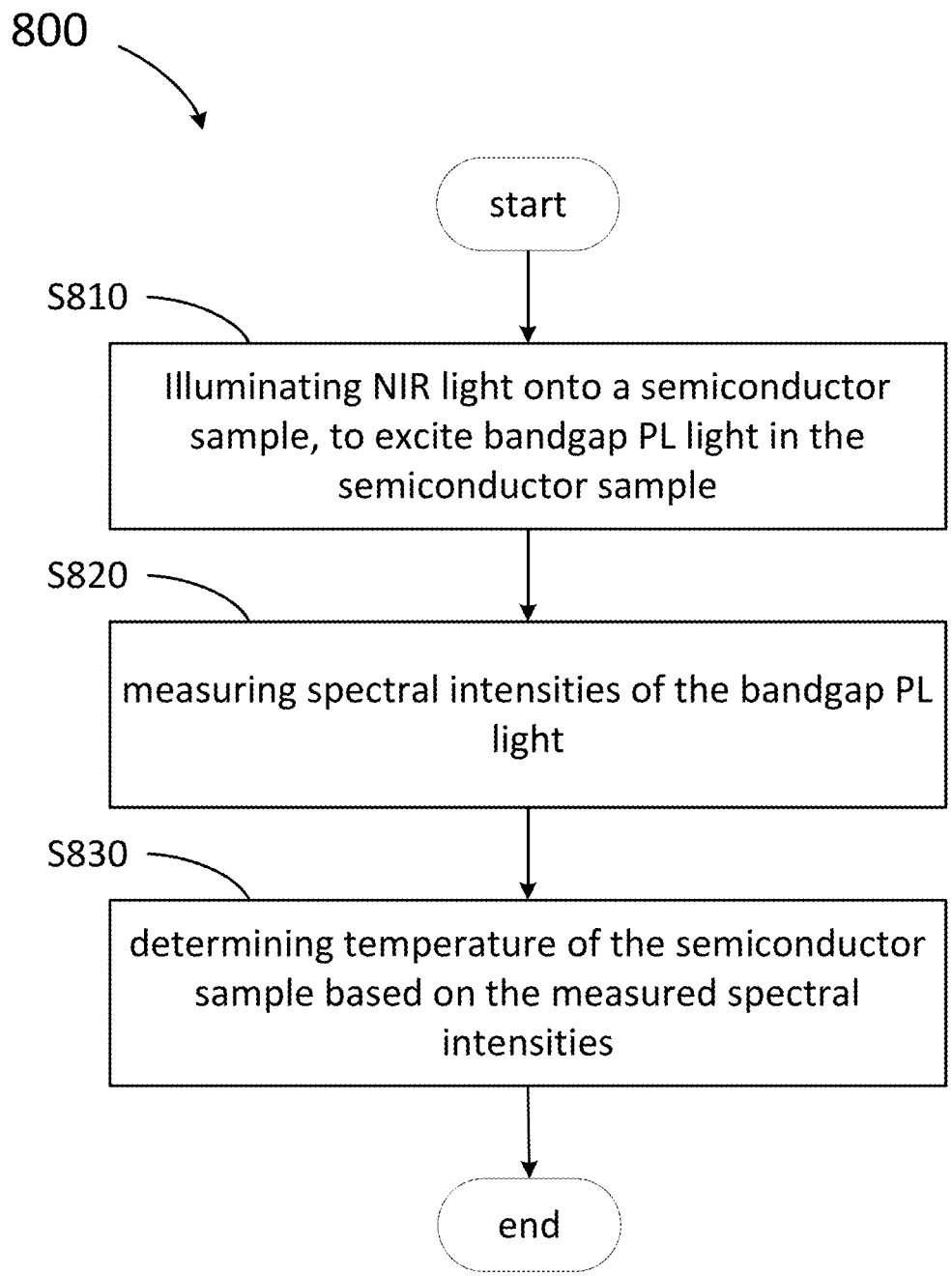
FIG. 8 is a flow chart of an exemplary method for remote temperature measurement in accordance with some embodiments of the present disclosure.

FIG. 8 is a flow chart of an exemplary method 800 for remote temperature measurement according to some embodiments of the present disclosure. Aspects of the method 800 can be implemented by the sensors 100 and 300 and the temperature sensor assemblies 400, 500 and 700. In various embodiments, some of the steps of the method 800 shown can be performed concurrently or in a different order than shown, can be substituted by other method steps, or can be omitted. Additional method steps can also be performed as desired.

At step S810, a semiconductor sample is illuminated with near-infrared (NIR) light, to excite bandgap photoluminescence (PL) light in the semiconductor sample. For example, the wafer 110 can be illuminated with the illumination beam 121 emitted by the NIR light source 120, to excite the bandgap PL light 115 in the wafer 110.

At step S820, spectral intensities of the bandgap PL light are measured. For example, the sensors 100 and 300 can be used to measure the spectral intensities of the bandgap PL light 115 excited from the wafer 110.

At step S830, the temperature of the semiconductor sample is determined based on the measured spectral intensities. For example, a controller can be coupled to the first and second photodiodes PD1 and PD2 (or the optical detector 170) and determine the temperature of the wafer 110 from the acquired PL spectral light intensities.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the present disclosure. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the present disclosure. Such variations are intended to be covered by the scope of this disclosure. As such, the foregoing descriptions of embodiments of the present disclosure are not intended to be limiting. Rather, any limitations to embodiments of the present disclosure are presented in the following claims.

What is claimed is:

1. A sensor for remote temperature measurement, comprising:
    a light source configured to form an illumination beam;
    focusing optics configured to direct the illumination beam from the light source onto a semiconductor sample at an illuminated spot thereof such that the illumination beam excites bandgap photoluminescence (PL) light in the semiconductor sample;
    collection optics configured to collect the bandgap PL light excited from the semiconductor sample;
    at least one optical detector configured to measure spectral intensities of the bandgap PL light in a vicinity of a semiconductor bandgap wavelength of the semiconductor sample; and
    transmission optics configured to transmit the bandgap PL light from the collection optics to the at least one optical detector.

2. The sensor of claim 1, wherein the transmission optics include a notch filter configured to suppress transmission of light at a wavelength of the illumination beam.

3. The sensor of claim 1, wherein the transmission optics include at least one of a dichroic mirror, a beam splitter, and an optical fiber.

4. The sensor of claim 1, wherein the focusing optics and the collection optics utilize a same lens for focusing the illumination beam onto the semiconductor sample and for collecting the bandgap PL light from the semiconductor sample, respectively.

5. The sensor of claim 1, wherein the light source includes a near-infrared (NIR) laser diode or a light emitting diode (LED).

6. The sensor of claim 5, wherein the illumination beam has a wavelength of 785 nm.

7. The sensor of claim 1, wherein the at least one optical detector includes a prism or grating spectrometer.

8. The sensor of claim 1, wherein the at least one optical detector includes at least two single-pixel detectors, each of which has an optical bandpass filter disposed in front thereof, each of the optical bandpass filters configured to transmit a wavelength or a range of wavelengths in the vicinity of the semiconductor bandgap wavelength of the semiconductor sample.

9. The sensor of claim 8, wherein the single-pixel detectors are photodiodes.

10. The sensor of claim 9, wherein the photodiodes are silicon (Si) photodiodes, germanium (Ge) photodiodes, or InGaAs photodiodes.

11. The sensor of claim 8, wherein the optical bandpass filters of the at least two single-pixel detectors have passband wavelengths of 1050 nm and 1125 nm, respectively.

12. The sensor of claim 1, wherein the semiconductor sample is a semiconductor wafer disposed within a wet processing bath, and the focusing optics and the collection optics are configured to direct the illumination beam onto the semiconductor wafer and collect the bandgap PL light from the semiconductor wafer, respectively, through one or more walls of the wet processing bath and through processing liquid present in the wet processing bath.

13. The sensor of claim 12, wherein the one or more walls are nested and include quartz.

14. The sensor of claim 12, wherein the processing liquid includes at least one of $H_3PO_4$, $H_2O$, $H_2O_2$, and $H_2SO_4$.

15. The sensor of claim 1, further comprising:
    a controller configured to acquire PL spectral light intensities from the at least one optical detector and determine the temperature of the semiconductor sample from the acquired PL spectral light intensities.

16. A temperature measurement apparatus, comprising:
    a base plate; and
    a plurality of the sensors of claim 1 mounted on and arranged across the base plate, the sensors configured to measure temperature of one or more semiconductor samples.

17. The temperature measurement apparatus of claim 16, wherein the base plate is disposed substantially parallel to one of the one or more semiconductor samples, and the sensors are configured to determine a temperature distribution across a surface of the one of the one or more semiconductor samples at a plurality of illuminated spots thereon that correspond to the sensors.

18. The temperature measurement apparatus of claim 16, wherein the base plate is disposed substantially perpendicular to the one or more semiconductor samples, and the sensors are configured to measure temperature at an edge of, or in a region proximate the edge of at least one of the one or more semiconductor samples.

19. The temperature measurement apparatus of claim 16, further comprising:
    a temperature control system configured to control temperature of the base plate and the sensors.

20. The temperature measurement apparatus of claim 19, wherein the temperature control system includes a temperature-controlled fluid manifold in contact with or embedded within the base plate.

21. The temperature measurement apparatus of claim 19, wherein the temperature control system includes one or more thermoelectric (TE) devices in contact with the base plate.

22. A wet semiconductor-processing system, comprising:
    a wet semiconductor-processing bath; and
    the temperature measurement apparatus of claim 18 configured to measure temperature of one or more semiconductor samples disposed within the wet semiconductor-processing bath through one or more walls of the wet semiconductor-processing bath and through processing liquid in the wet semiconductor-processing bath.

23. A method for remote temperature measurement, comprising:

illuminating a semiconductor sample with an illumination beam, to excite bandgap photoluminescence (PL) light in the semiconductor sample;

measuring spectral intensities of the bandgap PL light excited from the semiconductor sample; and determining temperature of the semiconductor sample based on the measured spectral intensities.

24. The method of claim 23, wherein measuring spectral intensities of the bandgap PL light includes measuring spectral intensities of the bandgap PL light at two wavelengths or two ranges of wavelengths in a vicinity of a semiconductor bandgap wavelength of the semiconductor sample.

* * * * *